(12) United States Patent
Mitchell et al.

(10) Patent No.: US 7,005,854 B2
(45) Date of Patent: Feb. 28, 2006

(54) SYNTHETIC APERTURE MRI

(75) Inventors: J. Ross Mitchell, Calgary (CA);
Gregory S. Mayer, Simcoe (CA); M. Louis Lauzon, Calgary (CA); Hongmei Zhu, Toronto (CA)

(73) Assignee: 976076 Alberta Inc., Calgary (CA)

( * ) Notice: Subject to any disclaimer, the term of this patent is extended or adjusted under 35 U.S.C. 154(b) by 0 days.

(21) Appl. No.: 10/875,359

(22) Filed: Jun. 25, 2004

(65) Prior Publication Data

US 2004/0263169 A1    Dec. 30, 2004

Related U.S. Application Data

(60) Provisional application No. 60/482,710, filed on Jun. 27, 2003.

(51) Int. Cl.
*G01V 3/00*    (2006.01)

(52) U.S. Cl. ...................................... 324/309; 324/307
(58) Field of Classification Search ................ 324/309, 324/307, 300, 318, 319, 322; 600/410, 425
See application file for complete search history.

(56) References Cited

U.S. PATENT DOCUMENTS

| 5,778,038 | A | * | 7/1998 | Brandt et al. .................... 378/4 |
| 6,549,801 | B1 | * | 4/2003 | Chen et al. ................... 600/425 |
| 6,839,471 | B1 | * | 1/2005 | Vogt, IV ...................... 382/280 |

OTHER PUBLICATIONS

Bae et al., "A Study of Synthetic-Aperture Imaging with Virtual Source Elements in B-Mode Ultrasound Imaging Systems", ", IEEE Transactions on Ultrasonics, Ferroelectrics, and Frequency Control", vol. 47, No. 6, pp. 1510-1519, Nov. 2000.

Borman et al., "Spatial Resolution Enhancement of Low-Resolution Image Sequences A Comprehensive Review with Directions for Future Research" Laboratory for Image and Signal Analysis, University of Notre Dame, USA, Jul. 8, 1998.

Elad et al., "Super-Resolution Reconstruction of Image Sequences", IEEE Transactions on Pattern Analysis and Machine Intelligence, vol. 21, No. 9, Sep. 1999.

Eren et al., "Robust, Object-Based high-Resolution Image Reconstruction from Low-Resolution Video", IEEE Transactions on Image Processing, vol. 6, No. 10, pp. 1446-1451, Oct. 1997.

Frazier et al., "Synthetic Aperture Techniques with a Virtual Source Element", IEEE Transactions on Ultrasonics, Ferroelectrics, and Frequency Control, vol. 45, No. 1, Jan. 1998.

Greenspan et al., "MRI Inter-Slice Reconstruction using Super-Resolution", Magnetic Resonance Imaging, No. 20, pp. 437-446, 2002.

(Continued)

*Primary Examiner*—Brij B. Shrivastav
(74) *Attorney, Agent, or Firm*—Freedman & Associates

(57) ABSTRACT

The present invention relates to a method and system for enhancing resolution of a magnetic resonance image of an object. The method combines information from a plurality of low-resolution images with a Field Of View shifted by a distance less than a pixel width to create a synthesized image having substantially improved image quality. Information from the low-resolution images is merged and application of an aperture function enhances the SNR of the synthesized image resulting in synthesized images having a substantially higher spatial resolution as well as a substantially increased SNR. The method and system for enhancing resolution of a magnetic resonance image is highly beneficial for a MRI practitioner by substantially improving image quality, thus facilitating diagnostic methods such as texture analysis and disease specific tissue segmentation.

27 Claims, 9 Drawing Sheets

Low Resolution Data        Zero Interleaved Data        Merged Data zero interleave ⇒        sum ⇒

OTHER PUBLICATIONS

Irani et al., "Motion Analysis for Image Enhancement: Resolution, Occlusion, and Transparency", Journal of Visual Communication and Image Representation, vol. 4, No. 4, pp. 324-335, Dec. 1993.

Karaman et al., "Synthetic Aperture Imaging for Small Scale Systems", IEEE Transactions on Ultrasonics, Ferroelectrics, and Frequency Control, vol. 42, No. 3, pp. 429-442, May 1995.

Kim et al., "Recursive Reconstruction of High-Resolution Image From Noisy Undersampled Multiframes", IEEE Transactions on Acoustics, Speech, and Signal Processing, vol. 38, No. 6, pp. 1013-1027, Jun. 1990.

Liang et al., "Constrained Reconstruction Methods in MR Imaging", Reviews of Magnetic Resonance in Medicine, vol. 4, pp. 67-185, 1992.

Peled et al., "Superresolution in MRI: Application to Human White Matter Fabric Tract Visualization by Diffusion Tensor Imaging", Magnetic in Medicine, No. 45, pp. 29-35, 2001.

Peled et al., "Superresolution in MRI—Perhaps Sometimes", Magnetic Resonance in Medicine, No. 48, pp. 409, 2002.

Roullot et al., "Regularized Reconstruction of 3D High-Resolution Magnetic Resonance Images from Acquisitions of Anisotropically Degraded Resolutions", IEEE, pp. 346-349, 2000.

Stergiopoulos et al., "Extended Towed Array Processing by an Overlap Correlator", Journal of the Acoustical Society of America, vol. 86, No. 1, pp. 158-171, Jul. 1989.

Scheffler, "Superresolution in MRI?", Magnetic Resonance in Medicine, No. 48, pp. 408, 2002.

Tsai et al., "Multiframe Image Restoration and Registration", Advances in Computer Vision and Image Processing, vol. 1, pp. 317-339, 1984.

Ur et al., "Improved Resolution from Subpixel Shifted Pictures", CVGIP: Graphical Models and Image Processing, vol. 54, No. 2, pp. 181-186, Mar. 1992.

Yen et al., "Application of Synthetic-Aperture Processing Toward-Array Data", Journal of the Acoustical Society of America, vol. 86, No. 2, pp. 754-765, Aug. 1989.

* cited by examiner

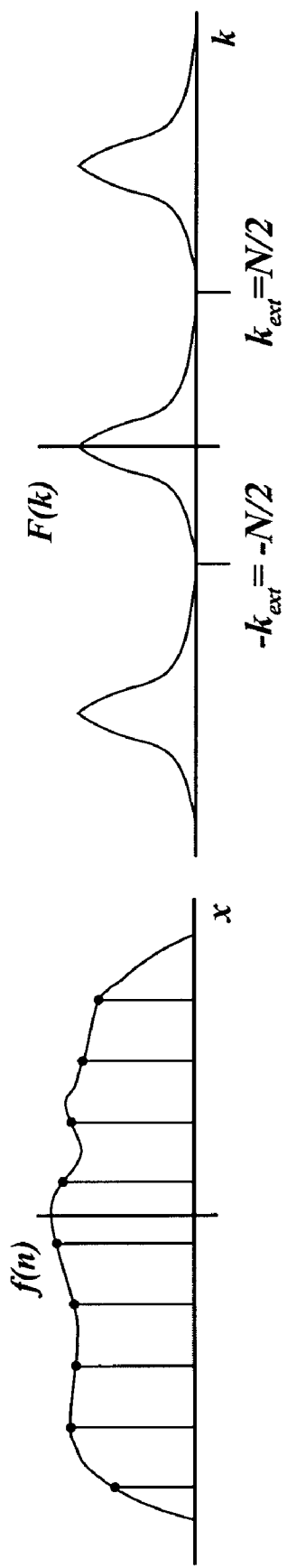
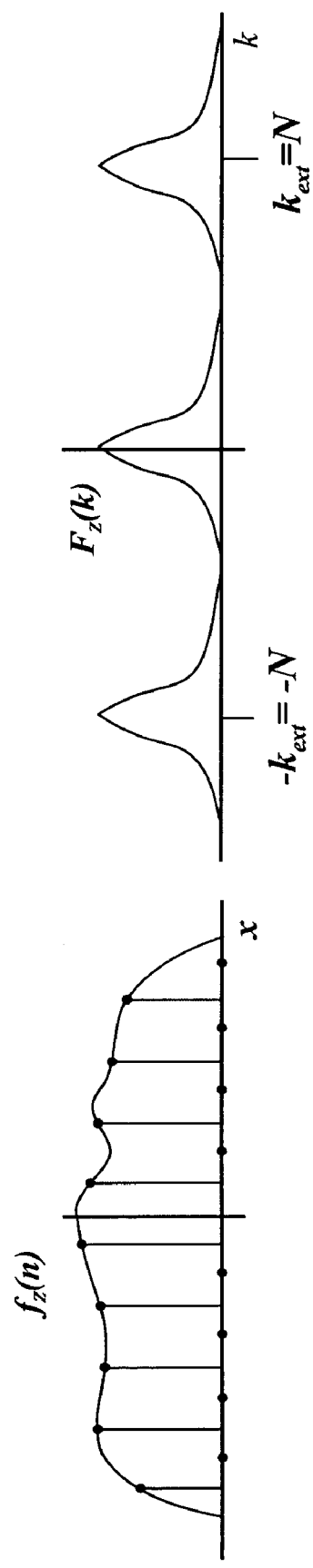
Fig. 3a
Fig. 3b
Fig. 3c
Fig. 3d

SYNTHETIC APERTURE MRI

This application claims benefit from U.S. Provisional Application No. 60/482,710 filed Jun. 27, 2003.

FIELD OF THE INVENTION

This invention relates to magnetic resonance imaging and in particular to a new signal processing method based on synthetic aperture techniques in order to increase signal-to-noise ratio and/or spatial resolution.

BACKGROUND OF THE INVENTION

Magnetic resonance imaging (MRI) provides a powerful tool for non-invasive imaging for treatment assessment and for minimally invasive surgery. The contrast sensitivity of the MRI provides a capability of non-invasively revealing structures and functions of internal tissues and organs not known to other imaging techniques such as, for example, CT scan or Ultrasound.

The viability of MRI depends on the image quality it produces. To determine the diagnostic efficacy of a specific MRI, several parameters have been introduced that portray the overall quality of the image data and its capacity to present relevant information to the MRI practitioner. The parameters are: the total time necessary to acquire the data—the scan time, the total time the data is being recorded—the acquisition time, the signal-to-noise ratio (SNR), and the spatial resolution. These parameters are inter-related and, traditionally, an improvement in one of these parameters results in a trade-off in one or more of the others.

The spatial resolution is used to quantify the extent to which different features in an MRI image are distinguishable and accurate delineation of their boundaries is provided. Since the data in MRI are acquired in the Fourier domain, image processing methods that increase the spatial resolution do so by increasing the highest measured frequency. Unfortunately, sampling higher frequencies in k-space decreases the SNR.

Several methods for improving the spatial resolution in MRI have been taught, for example, improving the spatial resolution by estimating frequencies beyond the highest measured frequency. However, estimation of frequencies beyond those measured constitutes a venerable problem in signal and image processing. The means by which a priori information is obtained and included in methods that estimate the higher frequencies for improving the resolution has often been the focus of these techniques. In MRI inclusion of a priori conditions in "constrained reconstruction" methods as disclosed, for example, by Liang Z, Boada F, Constable R, Haacke E M, Lauterbur P, and Smith M: "Constrained Reconstruction Methods in MR Imaging", *Reviews of Magnetic Resonance in Medicine*, Vol. 4, pp. 67–185, 1992, have been found to improve the spatial resolution of a single low resolution image with varying levels of success. These methods are able to improve the spatial resolution, but at the risk of introducing new artifacts such as spurious ringing and SNR loss into the image. Spatial resolution enhancement methods utilizing multiple low-resolution images of an object provide an alternate approach to image reconstruction by bringing new a priori conditions to the reconstruction. Super-Resolution (SR) image processing has been first proposed by Tsai R and Huang T: "Multiframe image restoration and registration", *Advances in Computer Vision and Image Processing*, JAI Press Inc., Vol. 1, pp. 317–339. The SR image processing attempts to enhance the spatial—or temporal—resolution of an image—or set of images—derived from a sequence of images. The input data are images of a moving scene, for example, taken with a moving imaging apparatus. Super-Resolution MRI (SRMRI) is a recent approach that uses SR techniques in MRI, but has generated some debate in the literature regarding its validity. The first SRMRI approach was disclosed by Roullot E, Herment A, Bloch I, Nikolova M, Mousseaux E: "Regularized reconsctruction of 3D high-resolution magnetic resonance images from acquisitions of anisotropically degraded resolutions", 15th Int. Conf. on Patt. Rec., September 2000. The underlying physics that relates the desired high resolution image to the acquired low resolution images was not reported. A similar approach was later disclosed by Peled S and Yeshurun Y: "Superresolution in MRI: application to human white matter fiber tract visualization by diffusion tensor imaging", *Magnetic resonance in Medicine*, Vol. 45, pp. 29–35, 2001. The results appeared, on a qualitative level, to be more accurate than those images whose sample spacings were reduced via interpolation. Further investigations of SRMRI have been published by Greenspan H, Peled S, Oz G and Kiryati N: "MRI inter-slice reconstruction using super-resolution", *Proceedings of MICCAI 2001, Fourth International Conference on Medical Image Computing and Computer-Assisted Intervention, Lecture Notes in Computer Science, Springer*, October 2001, and Greenspan H, Oz G, Kiryati N and Peled S: "MRI inter-slice reconstruction using super-resolution", *Magnetic Resonance Imaging*, Vol. 20, pp. 437–446, 2002. However, the underlying MR physics relating the low-resolution images and the desired high-resolution image has not been reported, prompting skepticism regarding the validity of SR techniques in MRI as discussed in Scheffler K: "Superresolution in MRI?", *Magnetic Resonance in Medicine*, Vol. 48, p. 408, 2002, and in Peled S and Yeshurun Y: "Superresolution in MRI-perhaps sometimes", *Magnetic Resonance in Medicine*, Vol. 48, p. 409, 2002.

It would be advantageous to be able to overcome the shortcomings of the prior art by providing a MR image reconstruction process that is capable of synthesizing a high-resolution MR image that has a higher spatial resolution as well as a higher SNR. Furthermore, it would be advantageous to incorporate the underlying physics relating the low-resolution images and the desired high-resolution image in order to provide a more accurate estimate of the object being imaged.

SUMMARY OF THE INVENTION

It is, therefore, an object of the invention to provide a MR image reconstruction process capable of synthesizing from a sequence of sensed low-resolution images a high resolution MR image having a higher spatial resolution as well as a higher SNR.

It is further an object of the invention to incorporate the underlying physics of the MRI data acquisition process relating the low-resolution images and the desired high-resolution MRI image into the MRI image reconstruction process.

It is yet further an object of the invention to provide a MR image reconstruction process capable of synthesizing a high resolution MR image that is a more accurate estimate of the object being imaged than the low-resolution images by incorporating known phase information of the data acquisition process into the reconstruction.

In accordance with the present invention there is provided a method for enhancing resolution of a magnetic resonance image of an object comprising:
receiving a first analog Fourier domain signal indicative of a first magnetic resonance image of an area of the object;
receiving a second analog Fourier domain signal indicative of a second magnetic resonance image of the area of the object;
superposing a phase ramp on the first analog Fourier domain signal in frequency encode direction, the phase ramp corresponding to a shift of a field of view of the first image with respect to the field of view of the second image of less than a pixel width;
discretizing the first and the second analog Fourier domain signal producing a first and a second digital Fourier domain signal;
merging in Fourier domain the first and the second digital Fourier domain signal producing a merged digital Fourier domain signal;
deconvoluting the merged digital Fourier domain signal using an aperture function; and,
determining image data indicative of a synthesized magnetic resonance image of the area of the object by inverse Fourier transforming the merged digital Fourier domain signal, the synthesized magnetic resonance image having substantially higher resolution than the first and the second magnetic resonance image.

In accordance with an aspect of the present invention there is provided a method for enhancing resolution of a magnetic resonance image of an object comprising:
receiving N analog Fourier domain signals indicative of N magnetic resonance images of an area of the object;
superposing a phase ramp on each of the first to N-1$^{th}$ analog Fourier domain signals in frequency encode direction, the phase ramp corresponding to a different shift of a field of view of each of the first to N-1$^{th}$ images with respect to the field of view of the N$^{th}$ image of less than a pixel width;
discretizing the N analog Fourier domain signals producing N digital Fourier domain signals;
merging in the Fourier domain the N digital Fourier domain signals producing a merged digital Fourier domain signal;
deconvoluting the merged digital Fourier domain signal using an aperture function; and,
determining image data indicative of a synthesized magnetic resonance image of the area of the object by inverse Fourier transforming the merged digital Fourier domain signal, the synthesized magnetic resonance image having substantially higher resolution than the N magnetic resonance images.

In accordance with the present invention there is further provided a system for enhancing resolution of a magnetic resonance image of an object comprising:
a ramp circuitry for superposing a phase ramp on a first analog Fourier domain signal in frequency encode direction, the first analog Fourier domain signal being indicative of a first magnetic resonance image of an area of the object, the phase ramp corresponding to a shift of a field of view of the first magnetic resonance image with respect to the field of view of a second magnetic resonance image of less than a pixel width;
an A/D converter in communication with the ramp circuitry for discretizing the first analog Fourier domain signal and a second analog Fourier domain signal indicative of the second magnetic resonance image of the area of the object producing a first and a second digital Fourier domain signal; and,
a processor in communication with the A/D converter, the processor for:
merging in the Fourier domain the first and the second digital Fourier domain signal producing a merged digital Fourier domain signal;
deconvoluting the merged digital Fourier domain signal using an aperture function; and,
determining image data indicative of a synthesized magnetic resonance image of the area of the object by inverse Fourier transforming the merged digital Fourier domain signal,
the synthesized magnetic resonance image having substantially higher resolution than the first and second magnetic resonance image.

In accordance with an aspect of the present invention there is further provided a storage medium having executable commands for execution on at least a processor stored therein, the at least a processor when executing the commands performing:
receiving a first digital Fourier domain signal indicative of a first magnetic resonance image of an area of an object;
receiving a second digital Fourier domain signal indicative of a second magnetic resonance image of the area of the object, the second digital Fourier domain signal having superposed a phase ramp corresponding to a shift of a field of view of the second magnetic resonance image with respect to the field of view of the first magnetic resonance image of less than a pixel width;
merging in the Fourier domain the first and the second digital Fourier domain signal producing a merged digital Fourier domain signal;
deconvoluting the merged digital Fourier domain signal using an aperture function; and,
determining image data indicative of a synthesized magnetic resonance image of the area of the object by inverse Fourier transforming the merged digital Fourier domain signal, the synthesized magnetic resonance image having substantially higher resolution than the first and the second magnetic resonance image.

BRIEF DESCRIPTION OF THE FIGURES

Exemplary embodiments of the invention will now be described in conjunction with the following drawings, in which:

FIGS. 3a to 3d are diagrams schematically illustrating the Fourier model of zero interleaving;

DETAILED DESCRIPTION OF THE INVENTION

Figure 1C:
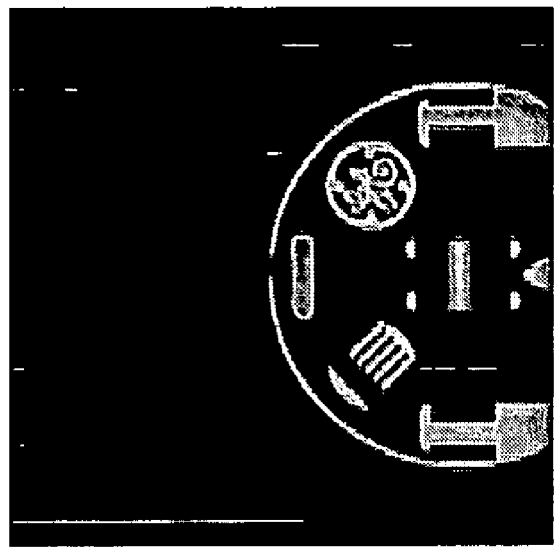
FIGS. 1a to 1c illustrate the effects of the application of a phase ramp to a phantom image.

The Synthetic Aperture MRI (SAMRI) process according to the invention is based on concepts derived from Synthetic Aperture (SA) radar and SR imaging. The SAMRI process uses repeated imaging together with information about an aperture function—or point-spread function—to increase the SNR of a synthesized magnetic resonance image. The SAMRI process combines information from a plurality of low-resolution images with a Field Of View (FOV) shifted by distances less than a pixel width to create a synthesized image having substantially improved image quality. Information from the low-resolution images is merged and application of a deconvolution process enhances the SNR of the synthesized image. It was found that the synthesized image had a higher SNR and is a substantially accurate representation of the object being imaged.

The discretization of the analog MR signal plays a significant role in the data acquisition for the SAMRI process. MR data is collected as a continuous time domain signal. Since time is parameterized into spatial frequency, it is possible to describe the data acquisition process in the Fourier domain. The discretization of the analog Fourier domain signal comprises a sequence of steps. First, the analog Fourier domain signal s(k) is convolved with an Anti-Aliasing (AA) filter A(k). The Analog-to-Digital (A/D) converter then calculates values of the signal at integer multiples of the sampling period $\Delta k$. To meet the Nyquist criterion, $\Delta k$ is determined to be sufficiently small to avoid possible aliasing in the image domain. The sampling is modeled as a multiplication with the shah function $1/\Delta k \, III(k/\Delta k)$. The A/D converter also truncates the signal at $(M-1)\Delta k$, by sampling M points modeled as a multiplication of the signal with the rect function, $1/(M\Delta k) \Pi(k/(M\Delta k))$.

Applying the Fourier shift theorem, translation of the FOV by a distance a corresponds to a phase ramp $\exp(-i2\pi ak)$ in the frequency domain. In a spin-warp imaging sequence one of the visualized image directions is the Frequency Encode (FE) direction, and the other is the Phase Encode (PE) direction. A phase ramp is applicable in either of these directions to shift the image, but produces different results depending upon whether it is applied before or after the AA filter. In the FE direction the analog MR signal exists briefly as a continuous entity before discretization. Thus, a phase ramp is imposed on the analog MR signal before it is passed through the AA filter and discretized:

$$S(m\Delta k) = \frac{1}{M\Delta k^2} \{[e^{-i2\pi ak} S(k)] * A(k)\} \Pi\left(\frac{k}{M\Delta k}\right) III\left(\frac{k}{\Delta k}\right) \quad (1)$$

where * denotes convolution. However, application of a phase ramp after signal discretization—for example, to data in the PE direction—is modeled as:

$$S'(m\Delta k) = \frac{e^{-i2\pi am\Delta k}}{M\Delta k^2} \left\{ [S(k) * A(k)] \Pi\left(\frac{k}{M\Delta k}\right) III\left(\frac{k}{\Delta k}\right) \right\} \quad (2)$$

Figure 1B:
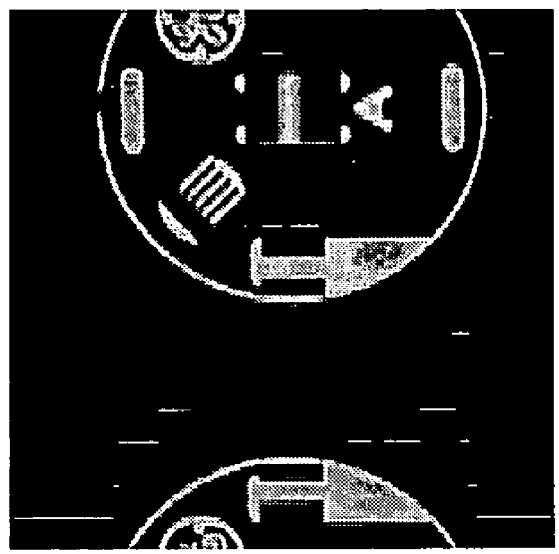
Figure 1A:
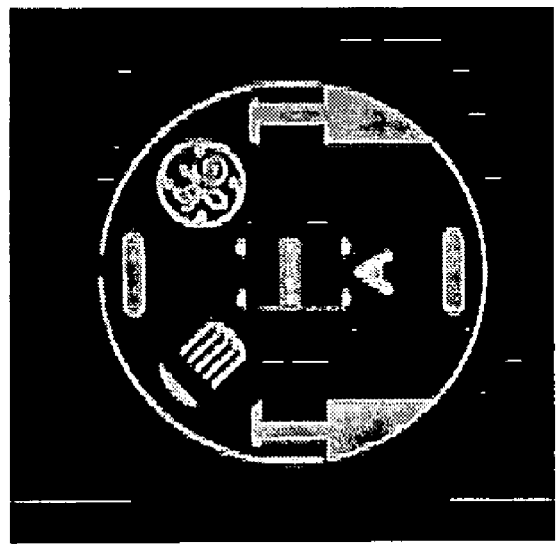

There is a fundamental difference between a phase ramp applied in the FE and PE directions. If the operations of equations (1) and (2) were the same, $S(m\Delta k)$ and $S''(m\Delta k)$ would be equivalent. However, the signals $S(m\Delta k)$ and $S''(m\Delta k)$ are equivalent only if $A(k)=\delta(k)$, for $a\neq0$ and general $S(k)$, because the operation $[\exp(i\Phi)S(k)]*A(k)$ is not in general, associative, i.e., $\exp(i\Phi)[S(k)*A(k)]\neq[\exp(i\Phi)S(k)]*A(k)$. If the phase ramp is applied after the AA filter, a wrapping artifact is possibly introduced because the image is periodic, as shown in FIG. 1b. FIGS. 1a to 1c illustrate the introduction of new information with an analog phase ramp. FIG. 1a shows an image of a Phantom collected using a 2D FSE sequence with FOV=16 cm. The FE direction is vertical, the PE direction horizontal. FIG. 1b illustrates a phase ramp applied in the PE direction producing a shift of the FOV of 5 cm resulting in a wrapping artifact. Here, the FOV shift provides no new observations of the object. However, a phase ramp applied before the AA filter, shown in FIG. 1c, shifts the FOV over a new area of the imaged object. Therefore, for the purpose of creating a merged data set, the FOV is shifted along the FE direction prior to AA filtering and signal discretization in order to gain new information for each acquired image of the multiple images.

Acquisition of multiple data sets with a FOV moving along the FE direction between acquisitions is a central component of SAMRI. Portions of the multiple images are merged into a single image by interleaving their pixels. Generation of the merged image is a process modeled in the Fourier domain to later develop an aperture function for ultimately enhancing the image quality of the merged image. For the sake of simplicity, the Fourier model for merging the image data will be explained using a one-dimensional case with two acquisitions. The object is translated by $\Delta x/2$ between acquisitions, where $\Delta x$ is the sample spacing. Let the inverse Discrete Fourier Transform (DFT) of the first and second acquired spectrums $L_1(m\Delta k)$ and $L_2(m\Delta k)$ be $l_1(m\Delta x)$ and $l_2(m\Delta x+\Delta x/2)$, respectively, for $m=0, 1, \ldots, M-1$. The merged data set $l(n\Delta x/2)$ is formed by interleaving portions of the data sets $l_1(m\Delta x)$ and $l_2(m\Delta x+\Delta x/2)$:

$$l(n\Delta x/2)=l_1^z(n\Delta x/2)+l_2^z(n\Delta x/2), n=0, 1, 2, \ldots, 2M-1 \quad (3)$$

where the zero interleaved series $l_1^z(n\Delta x/2)$ and $l_2^z(n\Delta x/2)$ are:

$$l_1^z(n\Delta x/2) = \begin{cases} l_1(n\Delta x/2), & n = 0, 2, 4, \ldots, 2M-2 \\ 0 & n = 1, 3, 5, \ldots, 2M-1 \end{cases} \quad (4)$$

$$l_2^z(n\Delta x/2) = \begin{cases} 0 & n = 0, 2, 4, \ldots, 2M-2 \\ l_2(n\Delta x/2) & n = 1, 3, 5, \ldots, 2M-1 \end{cases}$$

Figure 2:
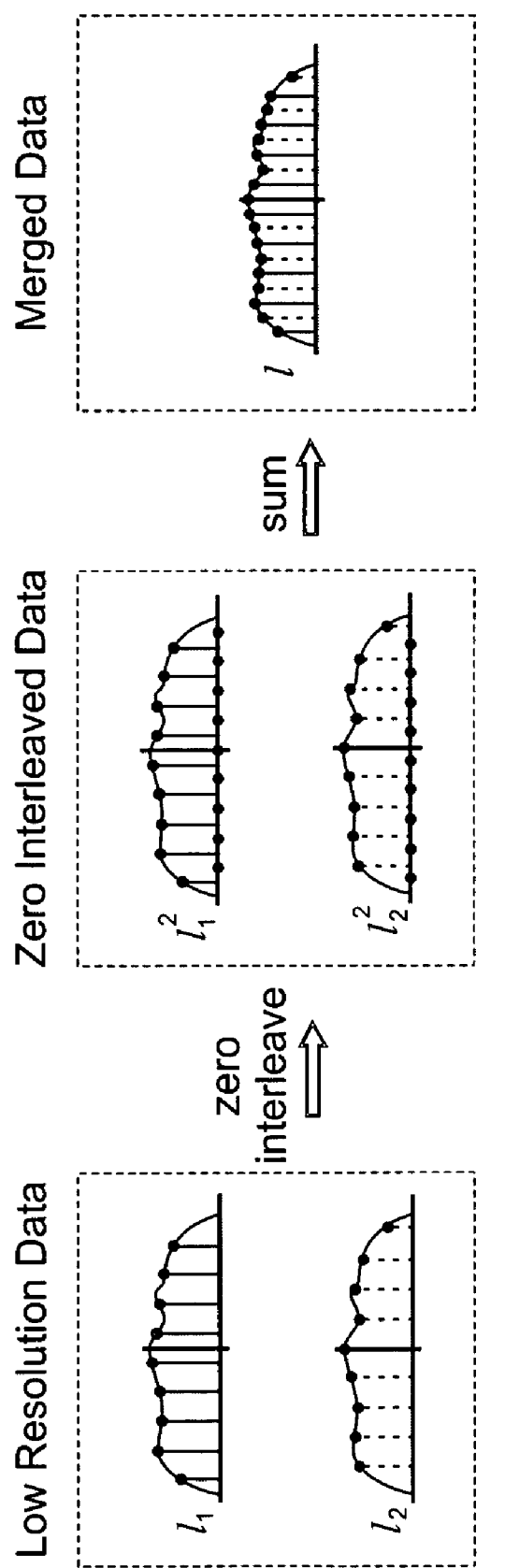
FIG. 2 is a diagram schematically illustrating generation of a merged data set using zero interleaving.

The generation of the merged data set from the low resolution series $l_1$ and $l_2$ is illustrated in FIG. 2. Zeros are interleaved into the data sets to produce $l_1^z$ and $l_2^z$. The zero interleaved signals are then summed to produce the merged data set l.

Application of the DFT to equation (3) yields:

$$L(n\Delta k)=L_1^z(n\Delta k)+L_2^z(n\Delta k), n=0, 1, 2, \ldots, 2M-1 \quad (5)$$

with $L_1^z(n\Delta k)$ and $L_2^z(n\Delta k)$ being the respective DFTs of $l_1^z(n\Delta x/2)$ and $l_2^z(n\Delta x/2)$. To construct a Fourier model of the merged data $L(n\Delta k)$ will now be modeled as a function of $L_1(m\Delta k)$ and $L_2(m\Delta k)$ via expressions for $L_1^z(n\Delta k)$ and $L_2^z(n\Delta k)$. Interleaving zeros into $l_1(m\Delta x)$ stretches its spectral extent by a factor of two as will be shown in the following.

Let f(m) be an arbitrary discrete signal with M samples and design a new sequence $f_z(n)$ with 2M=N samples by interleaving zeros in f(m):

$$f_z(n) = \begin{cases} f(n/2), n = 0, 2, 4, \ldots, N-2 \\ 0, n = 1, 3, 5, \ldots, N-1 \end{cases} \quad (6)$$

To obtain the DFT of $f_z(n)$, we use the inverse DFT of f(n/2):

$$f\left(\frac{n}{2}\right) = \sum_{k=0}^{N-1} F(k)\exp\left(+i2\pi\left(\frac{n}{2}\right)\frac{k}{N}\right) \quad (7)$$

F(k) is the DFT of f(m) and has period N$\Delta$k. To calculate the DFT of $f_z(n)$, we use the weighting factor w(n):

$$w(n) = \frac{1}{2}(1 + \exp(+i\pi n)), \; n = 0,1,2,\ldots \quad (8)$$
$$= \begin{cases} 1, n = 0, 2, 4, \ldots \\ 0, n = 1, 3, 5, \ldots \end{cases}$$

Combining equations (6), (7), and (8) yields:

$$f_z(n) = \frac{1}{2}\sum_{k=0}^{M-1} F(k)\exp\left(i2\pi\frac{nk}{2M}\right)[1 + \exp(in\pi)] \quad (9)$$
$$= \frac{1}{2}\sum_{k=0}^{M-1} F(k)\left[\exp\left(i\frac{2\pi nk}{2M}\right) + \exp\left(i\frac{2\pi n}{2M}(k+M)\right)\right]$$
$$= \frac{1}{2}\sum_{k=0}^{M-1} F(k)\exp\left(i\frac{2\pi nk}{2M}\right) + \sum_{k=M}^{2M-1} F(k-M)\exp\left(i\frac{2\pi nk}{2M}\right)$$

Since F(k) has period M (for $\Delta$k=1), F(k−M)=F(k). Thus, equation (9) is rewritten as:

$$f_z(n) = \frac{1}{2}\sum_{k=0}^{2M-1} F(k)\exp\left(i\frac{2\pi nk}{2M}\right) \quad (10)$$
$$= \frac{1}{2}\sum_{k=0}^{N-1} F_z(k)\exp\left(i\frac{2\pi nk}{N}\right)$$

Hence, 2M=N is the period of $F_z(k)$, and $F_z(k)$=F(k), $\forall k$. From equation (10) follows that the values of the spectrums of $f_z$ and f are the same, but the extents of their spectrums are different by a factor of two. Interleaving zeros in the discrete signal f(n) stretches the spectral extent from M to 2M, if $\Delta$k=1. It is noted that if F(k) has period M it also has a period of 2M. FIGS. 3a to 3d illustrate the Fourier model of the zero interleaving. FIG. 3a shows an arbitrary discrete function f(n) and FIG. 3b the zero interleaved series $f_z(n)$. The periodic spectrum F(k) of f(n) with period N and extent N/2 is shown in FIG. 3c and the periodic spectrum $F_z(k)$ of $f_z(n)$ with extent 2M=N is shown in FIG. 3d. It is noted that F(k)=$F_z(k)$.

Over one period of $L_1^z(n\Delta k)$:

$$L_1^z(n\Delta k) = \begin{cases} L_1(n\Delta k), & 0 \leq n \leq M-1 \\ L_1(n\Delta k - M\Delta k), & M \leq n \leq 2M-1 \end{cases} \quad (11)$$

The series $l_2^z(n\Delta x/2)$ is nonzero at odd indexed positions. Similarly, $L_2^z(n\Delta k)$ is expressed as:

$$L_2^z(n\Delta k) = \begin{cases} L_2(n\Delta k), & 0 \leq n \leq M-1 \\ L_2(n\Delta k - M\Delta k)e^{-\pi i}, & M \leq n \leq 2M-1 \end{cases} \quad (12)$$

Interleaving zeros into $l_2^z(n\Delta x/2)$ at positions n=0, 2, 4, ... 2M−2, and inducing a spatial shift of the FOV equal to $\Delta x/2$ between acquisitions led to the phase term $e^{-\pi i}$=−1 in equation (12) as will be shown in the following.

Let f(m+½), m=0, 1, 2, ..., M−1, be an arbitrary signal that is shifted from the origin by a distance of ½. To generate a zero interleaved sequence $f_z$ from f(m+½), equation (8) and a convolution with a shifted delta function is applied:

$$f_z(n) = 2\sum_{m=-1}^{2M-2} f\left(\frac{m+1}{2}\right)w(m)\delta(m-n+1), \quad (13)$$
$$n = 0, 1, 2, 3, \ldots, 2M-1$$

The nonzero elements of $f_z$ are placed into the zero interleaved series at m=1,3,5,...,2M−1 by the convolution sum. From the Fourier shift theorem this convolution corresponds to a phase ramp in the frequency domain. However, because f is shifted from the origin by a distance of ½, a second phase ramp is produced in the frequency domain. The combination of these phase terms simplifies equation (13) to:

$$f_z(n) = \sum_{k=0}^{M-1} F(k)e^{2\pi i\frac{nk}{2M}} + e^{i\pi}\sum_{k=M}^{2M-1} F(k)e^{2\pi i\frac{nk}{2M}} \quad (14)$$

Since F(k) has period M, F(k)=F(k−M), and by applying the DFT to equation (14) we obtain:

$$F_z(k) = \begin{cases} F(k), & k = 0, 1, 2, 3, \ldots, M-1 \\ e^{i\pi}F(k), & k = M, M+1, \ldots, 2M-1 \end{cases} \quad (15)$$

Thus, from equation (15), the extent of the spectrums of $f_z$ and f are different by a factor of two. For k=M,M+1, ..., 2M−1, $F_z(k)$ is equal to F(k), times the scalar $e^{i\pi}$=−1.

Combining equations (5), (11), and (12) yields:

$$L(n\Delta k) = \quad (16)$$
$$\begin{cases} L_1(n\Delta k) + L_2(n\Delta k), & 0 \leq n \leq M-1 \\ L_1(n\Delta k = M\Delta k) - L_2(n\Delta k - M\Delta k), & M \leq n \leq 2M-1 \end{cases}$$

Equation (16) provides the desired Fourier model for the merged data set as well as means for calculating the merged MRI data directly in acquisition space—Fourier domain.

The SNR quality of the reconstructed image data is increased by introducing a priori information from an aperture function and object motion between acquisitions to the reconstruction process. To accomplish this, the merged signal $l(n\Delta x/2)$ is modeled as a convolution of a desired high-resolution signal $h(n\Delta x/2)$ with an aperture function $\psi(n\Delta x/2)$. Using the Fourier convolution theorem, we obtain:

$$L(n\Delta k) = \Psi(n\Delta k) \cdot H(n\Delta k), n=0, 1, 2, \ldots, 2M-1 \quad (17)$$

where $H(n\Delta k)$ and $\Psi(n\Delta k)$ are the respective DFTs of $h(n\Delta x/2)$ and $\psi(n\Delta x/2)$. Thus, we are able to calculate a synthesized Fourier signal $H_s(n\Delta k)$, which is an approximation to $H(n\Delta k)$:

$$H_s(n\Delta k) = L(n\Delta k)/\Psi(n\Delta k), n=0, 1, 2, \ldots, 2M-1 \quad (18)$$

For $H_s(n\Delta k)$ to remain finite, it is required that $\Psi(n\Delta k)$ be nonzero for $n=0, 1, \ldots, 2M-1$, which will be described hereinbelow. Through merging and using equation (18) it is possible to approximate a signal of twice the resolution with knowledge of only the low-resolution data and $\Psi(n\Delta k)$.

To implement equation (18) knowledge of $\Psi(n\Delta k)$ is needed. In order to obtain an expression for $\Psi(n\Delta k)$, we rearrange equation (18):

$$\Psi(n\Delta k) = L(n\Delta k)/H_s(n\Delta k), n=0, 1, 2, \ldots, 2M-1 \quad (19)$$

Combining equations (16) and (19) we obtain:

$$\Psi(n\Delta k) = \begin{cases} \dfrac{L_1(n\Delta k) + L_2(n\Delta k)}{H_s(n\Delta k)}, & 0 \leq n \leq M-1 \\ \dfrac{L_1(n\Delta k - M\Delta k) - L_2(n\Delta k - M\Delta k)}{H_s(n\Delta k)}, & M \leq n \leq 2M-1 \end{cases} \quad (20)$$

An alternate form of equation (20) is desired that does not depend on $H_s(n\Delta k)$. For $0 \leq n \leq M-1$, $L_1(n\Delta k) = H_s(n\Delta k)$ because these signals differ only in their spectral extent:

$$\Psi(n\Delta k) = \frac{L_1^z(n\Delta k) + L_2^z(n\Delta k)}{L_1^z(n\Delta k)}, 0 \leq n \leq M-1 \quad (21)$$

To further simplify equation (21), an expression relating $L_1^z(n\Delta k)$ and $L_2^z(n\Delta k)$ is desired. The relationship between these signals is modeled as:

$$L_2^z(n\Delta k) = L_1^z(n\Delta k)\exp[-2\pi i\Delta x(n\Delta k)/(2M)] \cdot R(n\Delta k)\exp[2\pi i\theta_r(n\Delta k)], 0 \leq n \leq M-1 \quad (22)$$

The first phase term accounts for the linear phase ramp applied between acquisitions. The terms $R(n\Delta k)$ and $\theta_r(n\Delta k)$ represent all other magnitude and phase differences, respectively, between $L_1^z(n\Delta k)$ and $L_2^z(n\Delta k)$. $\theta_r(n\Delta k)$ is due to sample interleaving and off resonance sources such as main field inhomogeneities, susceptibility-induced variations, and chemical shift. Possibly, off resonance sources contribute an additional object-dependent phase term that is not known a priori.

It is possible to measure the total phase difference, $\theta_{total}(n\Delta k)$, between $L_1^z(n\Delta k)$ and $L_2^z(n\Delta k)$:

$$\theta_{total}(n\Delta k) = \angle[L_1^z(n\Delta k)L_2^{z*}(n\Delta k)], 0 \leq n \leq M-1 \quad (23)$$

where $\angle$ is the phase angle of a function, and $L_2^{z*}(n\Delta k)$ is the complex conjugate of $L_2^z(n\Delta k)$. The phase difference $\theta_{total}(n\Delta k)$ accounts for phase discrepancies due to shifting the FOV, sample interleaving, and off resonance sources. By assuming $\theta_{total}(n\Delta k) = -2\pi i\Delta x(n\Delta k)/(2M) + \theta_r(n\Delta k)$ we introduce the model:

$$L_2^z(n\Delta k) = L_1^z(n\Delta k)\exp[2\pi i\theta_{total}(n\Delta k)] \cdot R(n\Delta k), 0 \leq n \leq M-1 \quad (24)$$

By allowing $\theta_{total}(n\Delta k)$ to be a function of the acquired data, it becomes more accurate by taking into account off resonance sources. However, $\theta_{total}(n\Delta k)$ will also be a function of the measured noise.

Under normal circumstances, it is expected that introducing a half pixel shift between acquisitions does not significantly change the total energy content of the image. Under these conditions, the magnitude, which represents the energy content of the image, will also be relatively unchanged. Thus, the amplitude term $R(n\Delta k)$ is approximated by unity for $0 \leq n \leq M-1$. This approximation, together with equation (24) yields:

$$\Psi(n\Delta k) = 1 + \exp[2\pi i\theta_{total}(n\Delta k)], 0 \leq n \leq M-1 \quad (25)$$

As expressed in equation (25), $\Psi(n\Delta k)$ allows calculating a synthesized high-resolution signal using equation (18) for $0 \leq n \leq M-1$. However, from equation (20), $\Psi(n\Delta k)$ is a function of $H_s(n\Delta k)$ for $M \leq n \leq 2M-1$, and therefore is not known with only the low-resolution data. $\Psi(n\Delta k)$ is set to unity for $M \leq n \leq 2M-1$ to avoid introducing a priori assumptions about the aperture function that have no physical basis. However, a discontinuity will arise at $n=M$. A smooth transition is preferable, which is accomplished by setting the high frequencies of $\Psi(n\Delta k)$ to equal $\Psi(M\Delta k-\Delta k)$ for $M \leq n \leq 2M-1$.

From equation (5), the sum $L_1^z(n\Delta k) + L_2^z(n\Delta k)$ is needed to obtain the merged image. Due to the translation introduced between acquisitions, sample interleaving, and off resonance sources, $L_1^z(n\Delta k)$ and $L_2^z(n\Delta k)$ are out of phase. Therefore, the addition of these incoherent signals results in reduced signal amplitude and reduction in SNR. Multiplying the merged data by the inverse of $\Psi(n\Delta k)$ refocuses the low-resolution images such that their sum is coherent, increasing the SNR of the merged image.

To avoid division by zero when calculating the inverse of $\Psi(n\Delta k)$, a real, positive constant $\alpha$ is added to equation (25):

$$\Psi(n\Delta k) = 1 + \alpha + \exp[2\pi i\theta_{total}(n\Delta k)], 0 \leq n \leq M-1 \quad (26)$$

As $\alpha$ approaches zero, the filter becomes unstable, and unwanted noise is added to $H_s(n\Delta k)$. As $\alpha$ is increased from zero, the filter becomes stable, but the sum $L_1^z(n\Delta k) + L_2^z(n\Delta k)$ loses coherence. In practice, a small value for $\alpha$ is chosen that maximizes the SNR of $H_s(n\Delta k)$.

Figure 4A:
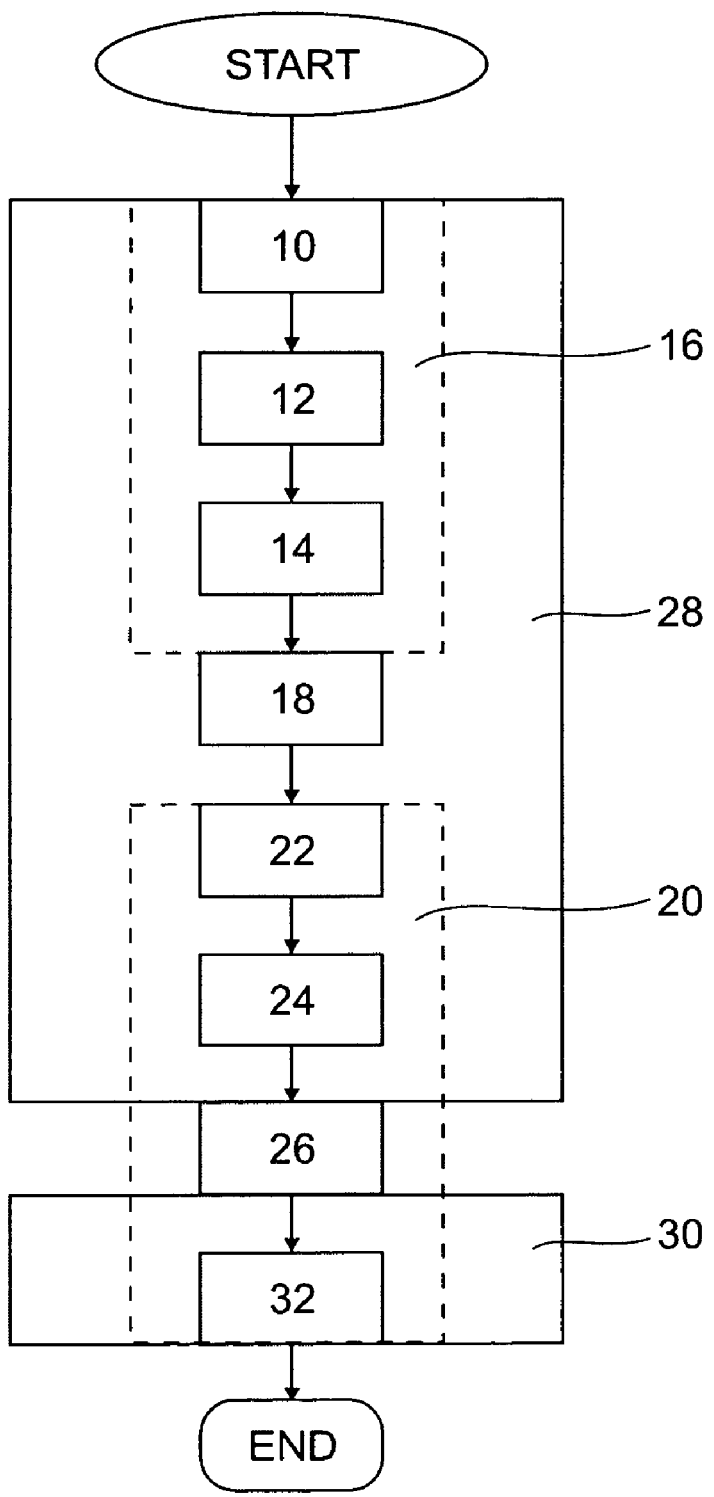
FIGS. 4a and 4b are simplified flow diagrams of two embodiments of a SAMRI process according to the invention.

Referring to FIG. 4a a simplified flow diagram of a preferred embodiment of the SAMRI process according to the invention is shown. A first and a second analog Fourier domain signal are received from a MR scanner—box 10. The first and the second analog Fourier domain signal are indicative of a first and a second magnetic resonance image of an area of an object. A phase ramp is then superposed on one of the first and the second analog Fourier domain signal—box 12, as discussed above with respect to equation (1)—function A(k). The phase ramp is superposed in FE direction and corresponds to a translation of the FOV of the image of less than a pixel width in space. Aliasing is a problem in MRI imaging that occurs when a part of the object outside the FOV is excited. The AA filter not only limits the signal from aliasing, but also limits the effects of noise from aliasing. Since the analog Fourier domain signals are acquired continuously in FE direction, the analog AA filtering is applied in the FE direction. Box 14 indicates AA filtering of both analog Fourier domain signals after superposing the phase ramp. The steps indicated by boxes 10 to 14 indicate the analog signal processing portion 16 of the SAMRI process. Indicated by box 18, the first and the second analog Fourier domain signal are discretized using an A/D converter producing a first and a second digital Fourier domain signal for the following digital signal processing 20. Using a processor, the first and the second digital Fourier domain signal are merged to form a merged digital Fourier domain signal—box 22. The first and the second digital Fourier domain signal are merged using an interleaving process—equation (16)—that models in the Fourier domain interleaving of image pixels of the first and the second magnetic resonance image. Implementation of an aperture function enables substantially recovering of image information lost due to dephasing occurring between acquisitions. The recovery of this information substantially increases the SNR and spatial resolution of the image. Referring to box 24, the merged digital Fourier domain signal is deconvoluted using an aperture function—equation 18—and, for example, Fourier division. Finally, inverse Fourier transformation—box 26—is applied to transform the merged digital Fourier domain signal from the Fourier domain 28 into space domain 30 producing image data 32 indicative of a synthesized magnetic resonance image of the area of the object. The synthesized magnetic resonance image has substantially higher resolution than the first and second magnetic resonance image.

As is evident, there are numerous possibilities for implementing the aperture function—box 24. For example, the constant of the aperture function—equation (26)—is determined by repeatedly processing the merged digital Fourier domain signal using different values for the constant and determining the SNR of the synthesized images. The constant corresponding to the synthesized image having the highest SNR is the selected. Optionally, the constant is determined by implementing an optimization procedure, which is initialized using predetermined values for the constant. Further optionally, the constant is replaced by a non-zero parameter that is spatially varying for better approximation of the aperture function in different image portions. A yet further option is provided by estimating the high frequency content of the aperture function based on high frequency information collected during a pre-scan.

Alternatively, the synthesized image is generated by merging more than two Fourier domain signals, thus incorporating information from more than two images and thereby obtaining even higher spatial resolution of the synthesized image. However, successive gains in SNR and accuracy are reduced as even higher frequencies of the aperture function have to be estimated. In case of merging a plurality of N Fourier domain signals a phase ramp is superposed on N−1 of the N Fourier domain signals. The phase ramps correspond to a different translation of the FOV of each of the N−1 images of less than a pixel width.

Figure 4B:
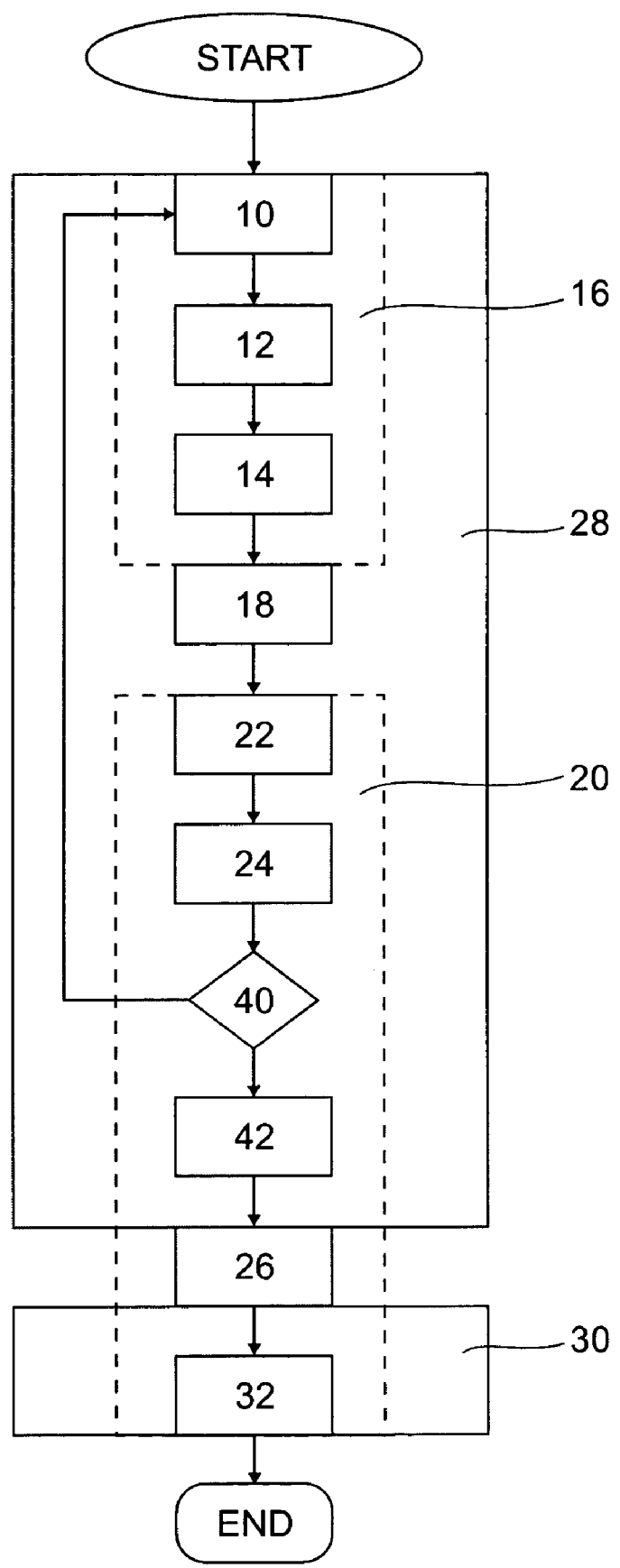

In the embodiment shown in FIG. 4a the SAMRI process is, for example, applied to one direction—FE direction—of a 2D image. In an alternative embodiment, shown in FIG. 4b, the SAMRI process is applied to a second set of a plurality of analog Fourier domain signals—box 40. The second set of analog Fourier domain signals is acquired along different axes of the frequency domain with respect to the object. For example, the first set is acquired with the FE direction being aligned with the x direction of the 2D image and the second set is acquired with the FE direction being aligned with the y direction of the 2D image. The merged Fourier domain signals of the two sets are then combined—box 42—and transformed—box 26—providing image data indicative of a synthesized 2D image having increased spatial resolution and improved SNR in x and y direction. Optionally, the process is repeated again for providing synthesized 3D images.

Thus far, the SAMRI process according to the invention has been implemented using a minimum of two separate signal acquisitions. In some applications of MRI, time is simply not available to perform two or more acquisitions to obtain a single image. In a further embodiment of the SAMRI process one analog Fourier domain signal obtained from a single acquisition is split into two analog Fourier domain signals using an analog splitter. A phase ramp is then superposed to one of the two split analog Fourier domain signals and the same process as outlined above is applied in order to produce a synthesized image. However, because the signal is only measured once the noise is also only measured once reducing the improvement in SNR of the synthesized image.

Figure 5:
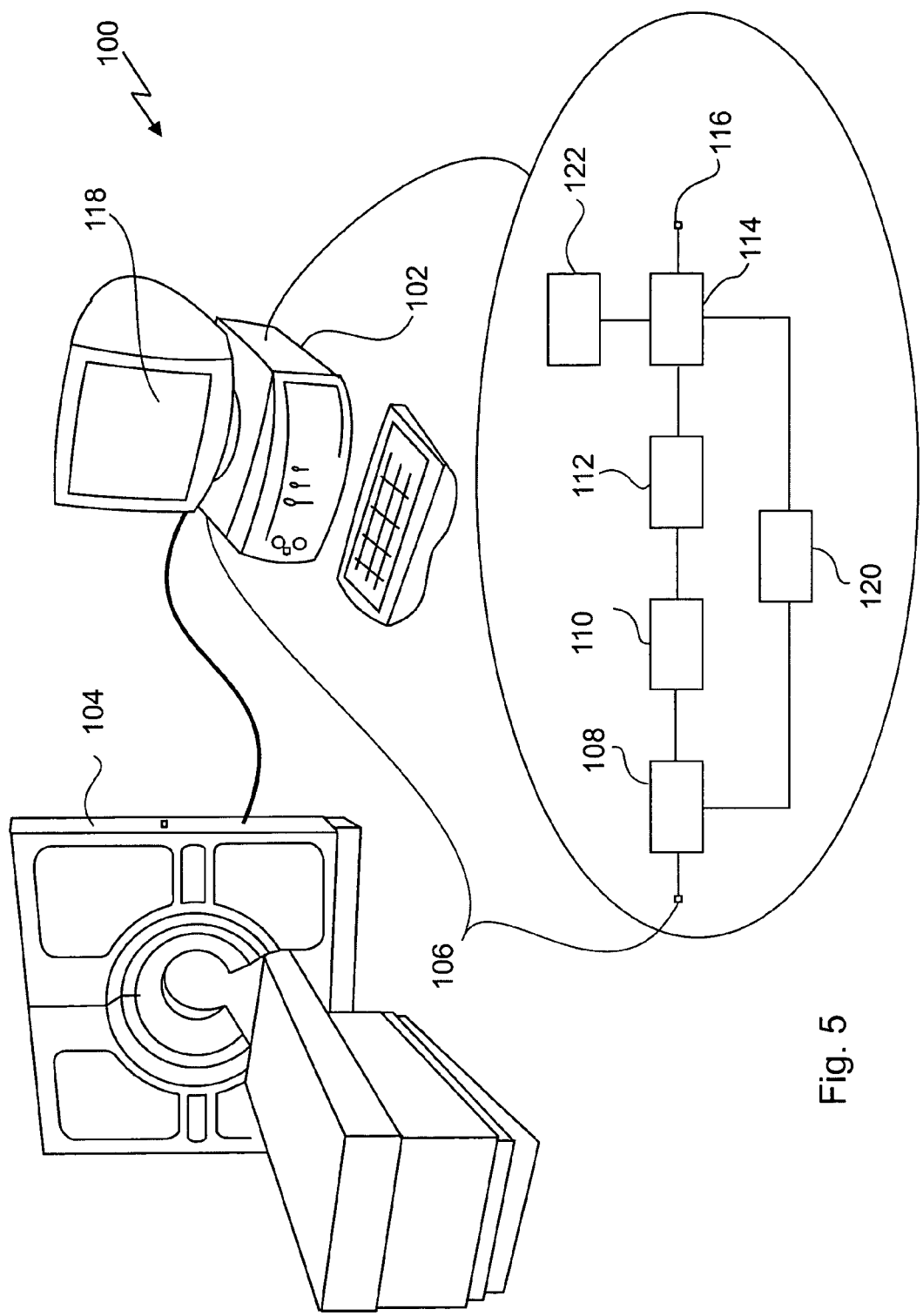
FIG. 5 is a simplified block diagram illustrating a system implementation the SAMRI process according to the invention.

Referring to FIG. 5, a system implementation 100 of the SAMRI process according to the invention is shown. In a preferred embodiment the SAMRI process is implemented using a workstation 102 linked to a MR scanner 104 via port 106 for communication therewith. A ramp circuitry 108 for superposing a phase ramp is connected to the port 106 followed by an AA filter 110. Analog signals are then discretized in A/D converter 112 and provided to processor 114. Image data indicative of a synthesized MR image are transmitted via port 116 to monitor 118 for display or, optionally, to other processing means for further processing such as extracting image features of an imaged object. Provision of the phase ramp is controlled by the processor 114 via a controller 120. Executable commands for being executed on the processor 114 for the processor to perform the SAMRI signal processing steps are stored in non-volatile memory 122. Alternatively, the SAMRI signal processing steps are executed using circuitry of a hardware implementation in the processor 114. Optionally, an analog splitter—not shown—is interposed between the port 106 and the ramp circuitry 108. The system 100 is implementable, for example, by inserting a circuit board comprising components 106 to 120 into an existing slot of a workstation, the slot providing communication with a bus of the workstation. Alternatively, the processor and the non-volatile memory are omitted on the circuit board and a processor and non-volatile memory of the workstation is used instead. As is evident, the system 100 is also implementable as a retrofit into existing MRI systems with only minor hardware changes.

Figure 6:
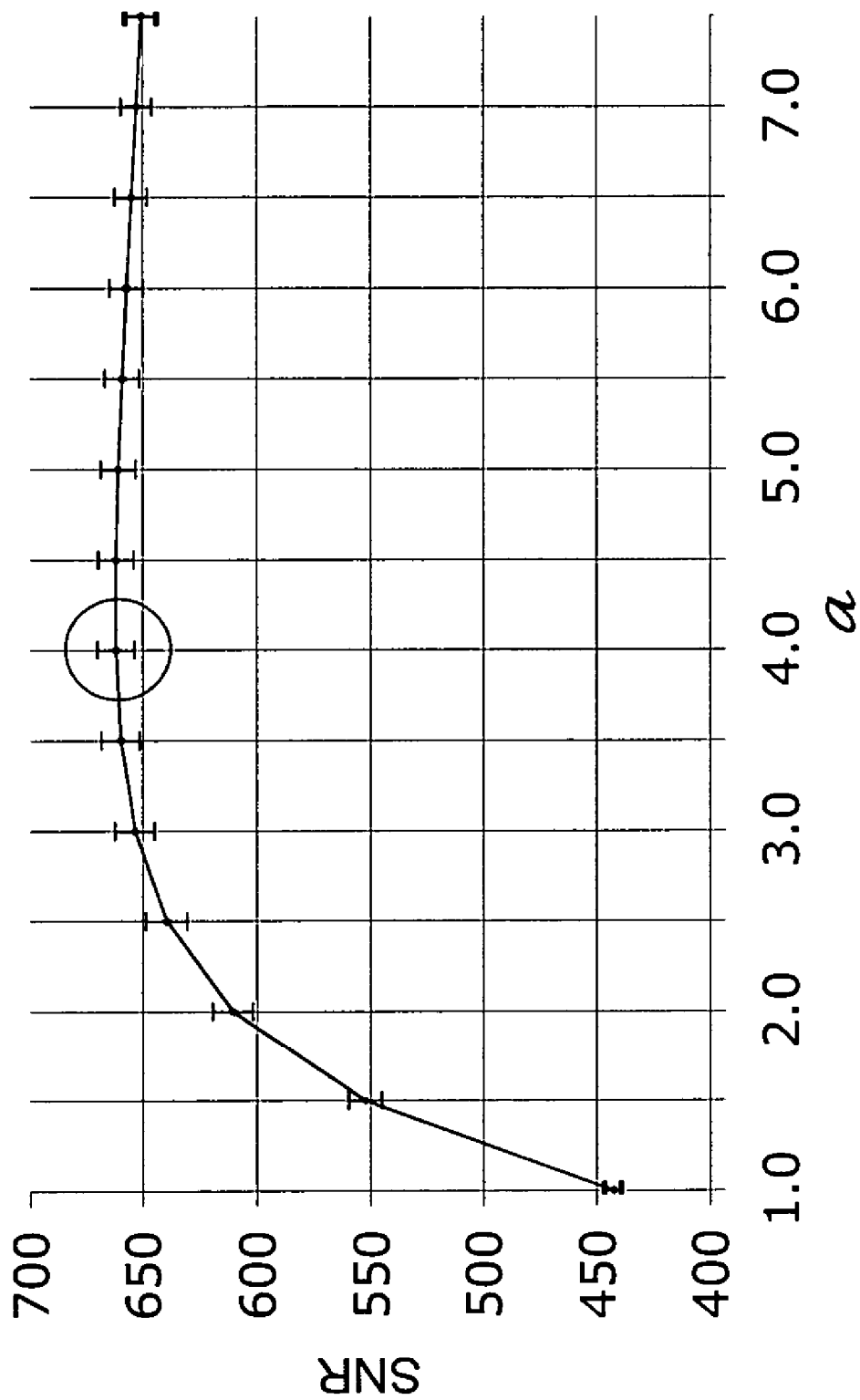
FIG. 6 is a diagram illustrating SNR for different aperture functions of an image synthesized using the SAMRI process.
Figure 7C:
FIGS. 7a to 7e are phantom images illustrating a comparison of a synthesized image using the SAMRI process with a low-resolution image and a high resolution image; and, FIGS. 8a and 8b are images of a healthy volunteer's brain illustrating a comparison of a synthesized image using the SAMRI process with a high resolution image.
Figure 7C:
Figure 7C:
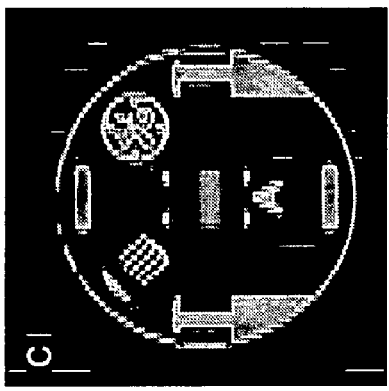
Figure 7E:
Figure 7B:
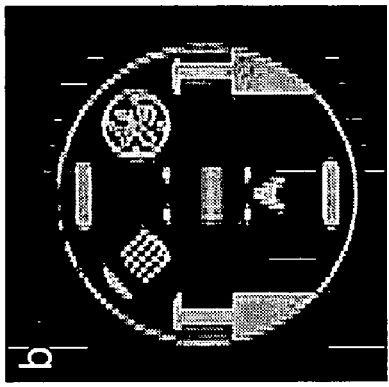
Figure 7D:
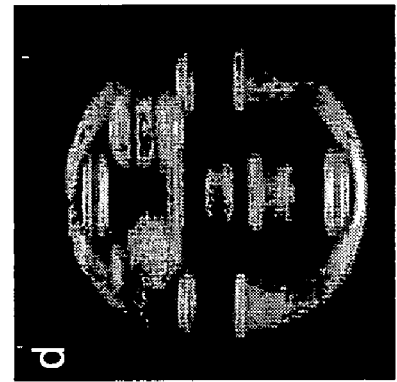
Figure 7A:
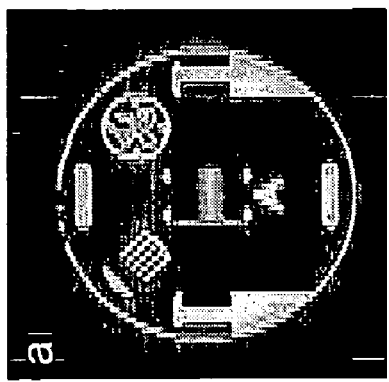

In MRI, resolution and SNR are related:

$$SNR \propto FOV_x \sqrt{\frac{N_{acq}}{BW_{read} N_x}} \quad (27)$$

where $N_{acq}$ is the number of acquisitions that are averaged, $BW_{read}$ is the FE bandwidth, $N_x$ is the number of FE samples, and $FOV_x$ is the field of view in the FE direction. Increasing $N_x$ during acquisition increases the spatial resolution. However, this results in an undesirable loss in SNR. Using the SAMRI process according to the invention provides increased image resolution without reducing the image SNR. Experiments have been performed to compare the SNR, acquisition time, and resolution obtained implementing the SAMRI process according to the invention with two images of different resolutions. A low-resolution image was compared to a high-resolution image with twice the number of readout samples $N_x$ and the same $FOV_x$. The low and high-resolution images were compared to a synthesized image produced with the SAMRI process. The SNR was measured by averaging the pixel intensities in a bright region of the image, and dividing the calculated value by the standard deviation of the pixel intensities in a noise region. All images have been acquired on a 3.0T MRI system (General Electric Medical Systems; Waukesha, Wis.) using a spin echo sequence, TE=15 ms, TR=1 s, slice thickness 5 mm, $N_{acq}$=1, FOV=25.6 cm, with 128 phase encode samples. Low and high-resolution images were acquired with 256 and 512 FE samples, respectively. To obtain the synthesized image, a second low-resolution image with 256 FE samples was obtained with a half pixel shift in the FE direction. The shift was implemented by applying a phase ramp before the AA filter. The two low-resolution images were combined to obtain a merged image with 512 FE samples. The aperture function was derived by calculating the optimal value of α for the merged image, shown in FIG. 6. FIG. 6 illustrates the SNR of a synthesized MR image for different aperture functions calculated by varying α. For small α, the aperture function is unstable. For large α, the low-resolution signals are out of phase. An optimal value of α—circled—is chosen to optimize the SNR of the synthesized image. The SNR values were averaged over ten trials and their standard errors are shown. The optimal aperture function was then used to deconvolve the merged image to generate a synthesized image.

The high-resolution data was acquired to quantify the similarity between these images and the synthesized images using the SAMRI process. The similarity between the synthesized and the high-resolution images was measured using their Normalized Sum of Intensity Differences (NSID). The NSID between two images $I_1(n,m)$ and $I_2(n,m)$ with N rows and M columns is:

$$NSID = \sum_{n=1}^{N} \sum_{m=1}^{M} \frac{|I_1(n,m) - I_2(n,m)|}{|I_1(n,m) + I_2(n,m)|} \tag{28}$$

A NSID has a maximum value of one when either $I_1(n,m)$ or $I_2(n,m)$ is zero, and is zero for $I_1(n,m)=I_2(n,m)$.

A second experiment was performed to provide an example of the SAMRI technique when applied to human brain data acquired from a healthy volunteer. The above procedure used for the phantom data was repeated for the volunteer data. All scan parameters were the same except that only one trial was performed, and the TR was changed to 2.5 s to obtain a higher SNR. The SNR for four regions was optimized over integer values of α between 0 and 60. The optimal α values and the corresponding SNRs of the synthesized and high-resolution images were calculated to compare results to the phantom data.

TABLE 1

| Image | Δx (mm) | $N_x$ | SNR mean | SNR std | Rel acq time | SNR efficiency | NSID mean | NSID std |
|---|---|---|---|---|---|---|---|---|
| Single Low Res | 1.0 | 256 | 609.6 | 9.4 | 1 | NA | 0.148 | 2.58E−03 |
| Synthesized | 0.5 | 512 | 659.8 | 10.2 | 2 | 466.7 | 0.105 | 1.94E−03 |
| Single High Res | 0.5 | 512 | 440.0 | 12.589 | 2 | 311.1 | 0.000 | 0.00E+00 |

Table 1 shows the relative resolutions, acquisition times, SNR efficiencies, and NSIDs of the low, synthesized, and high-resolution images obtained with the phantom data. The highest relative SNR efficiency (466.7) and lowest NSID (0.105) is obtained with the synthesized image. The relative acquisition time of the synthesized image is the same as the high-resolution image. The optimal α value was calculated for each of the ten trials, FIG. 6. The SNR was calculated from the synthesized SAMRI image. Mean values of α were calculated along with their corresponding standard errors. An optimal value of α for this phantom was four, and any value between two and seven achieved an improvement in SNR by a factor of about 1.08 compared to the merged image. Ten trials were used to obtain standard errors. In practice only a single trial is performed to calculate the optimal α to reduce the total scan time. FIGS. 7a to 7e show a comparison between a high-resolution image with 512 FE samples, FIG. 7a, a single low-resolution image using 256 FE samples, FIG. 7b, and a SAMRI synthesized image using two images with 256 FE samples each. Also shown are the absolute values of the differences between the low-resolution and the high-resolution image down-sampled by a factor of two, FIG. 7d, and the absolute values of the differences between the synthesized image and the high-resolution image, FIG. 7e. The difference images were smoothed by a 7×7 window to better visualize the local error magnitude.

Figure 8B:
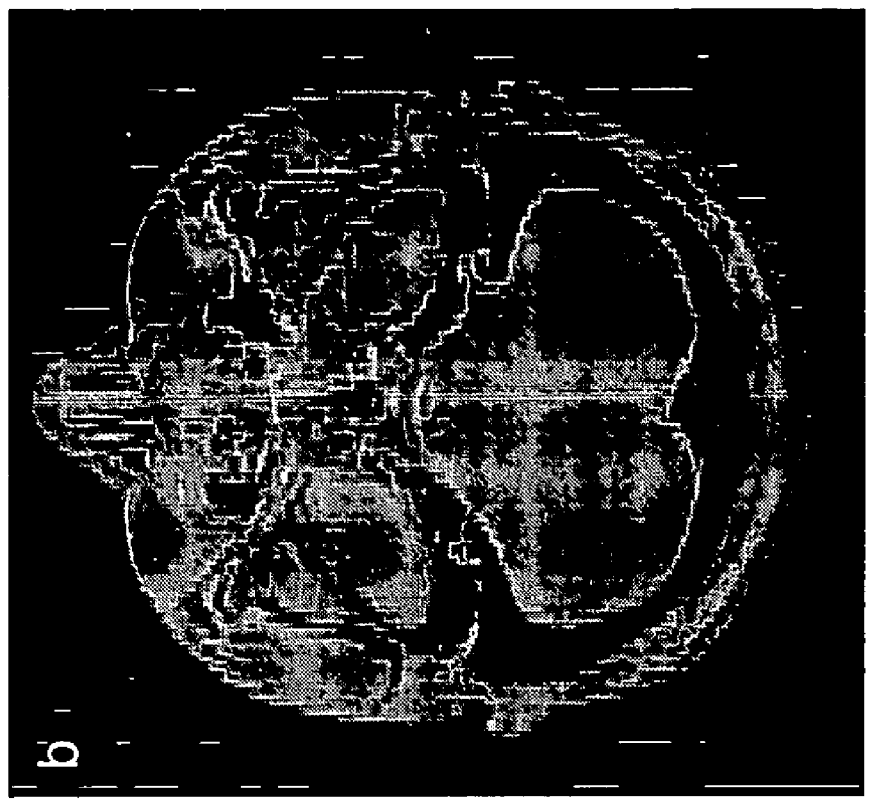
Figure 8A:
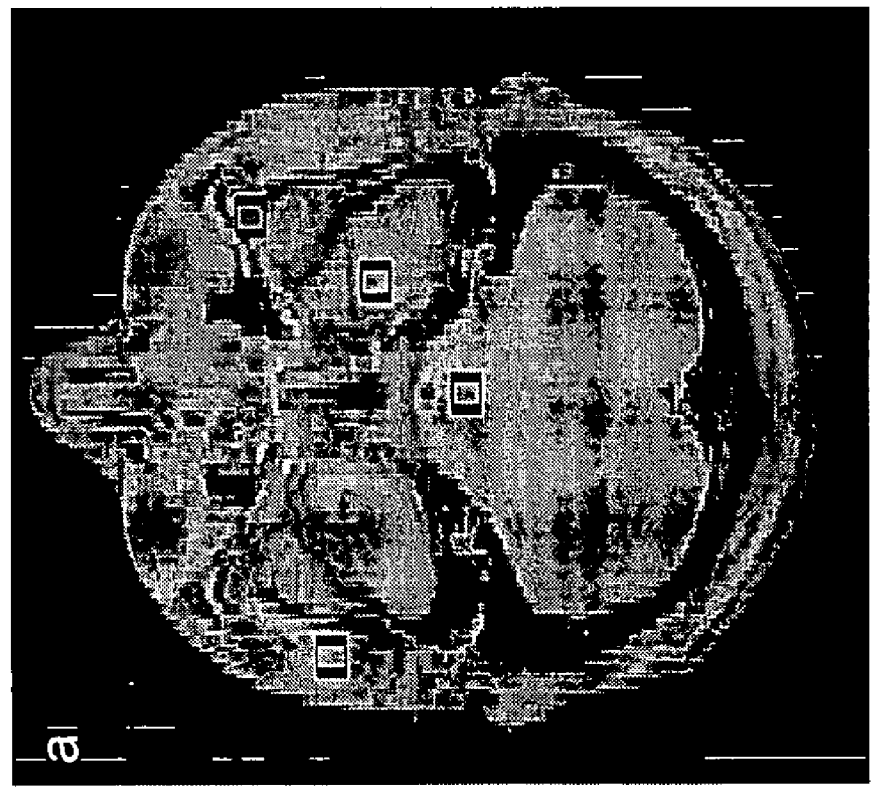

FIGS. 8a and 8b show a SAMRI synthesized image and a high-resolution image obtained with conventional imaging of a healthy volunteer brain, respectively. The synthesized image and the high-resolution image are very similar. The four Regions Of Interest ROI labeled in FIG. 8a have been used for SNR measurements illustrated in Table 2. Table 2 illustrates a comparison between the SAMRI synthesized image and the high-resolution image obtained with conventional imaging for human brain data. All ROIs have dimensions of 16×4. The SNR ratio between the synthesized and the high-resolution images was 1.50 for the phantom data. Values of α between 25 and 29 achieved an improvement in SNR by a factor of 1.46 to 1.64 in the synthesized images over the high-resolution image, which agrees well with the results from the phantom data.

TABLE 2

| ROI | Optimal α | SNR SAMRI synthesized | SNR High Res | SNR Ratio SAMRI to High Res |
|---|---|---|---|---|
| 1 | 26 | 131 | 84 | 1.56 |
| 2 | 29 | 282 | 193 | 1.46 |
| 3 | 25 | 238 | 158 | 1.50 |
| 4 | 26 | 305 | 186 | 1.64 |

The above test results are evidence that the SAMRI process according to the invention is capable of synthesizing a high-resolution MR image that has a higher spatial resolution as well as a higher SNR. By modeling the process of sample interleaving in the Fourier domain, an aperture function has been derived that increases the SNR as well as the spatial resolution of the synthesized image. Furthermore, Fourier modeling of the image data of the acquired images and the synthesized image has been used to address particular signal data acquisition strategies such that each acquired image contains information independent from the other image. The SAMRI process is highly beneficial for a MRI practitioner by substantially improving image quality, thus facilitating diagnostic methods such as texture analysis and disease specific tissue segmentation.

Numerous other embodiments of the invention will be apparent to persons skilled in the art without departing from the spirit and scope of the invention as defined in the appended claims.

What is claimed is:

1. A method for enhancing resolution of a magnetic resonance image of an object comprising:
    receiving a first analog Fourier domain signal indicative of a first magnetic resonance image of an area of the object;
    receiving a second analog Fourier domain signal indicative of a second magnetic resonance image of the area of the object;
    superposing a phase ramp on the first analog Fourier domain signal in frequency encode direction, the phase ramp corresponding to a shift of a field of view of the first image with respect to the field of view of the second image of less than a pixel width;
    discretizing the first and the second analog Fourier domain signal producing a first and a second digital Fourier domain signal;
    merging in Fourier domain the first and the second digital Fourier domain signal producing a merged digital Fourier domain signal;
    deconvoluting the merged digital Fourier domain signal using an aperture function; and,
    determining image data indicative of a synthesized magnetic resonance image of the area of the object by inverse Fourier transforming the merged digital Fourier domain signal, the synthesized magnetic resonance image having substantially higher resolution than the first and the second magnetic resonance image.

2. A method for enhancing resolution of a magnetic resonance image of an object as defined in claim 1 comprising anti aliasing filtering the first and second analog Fourier domain signal.

3. A method for enhancing resolution of a magnetic resonance image of an object as defined in claim 2 wherein the first and the second digital Fourier domain signal are merged using an interleaving process, the interleaving process modeling interleaving of image pixels of the first and the second magnetic resonance image in the Fourier domain.

4. A method for enhancing resolution of a magnetic resonance image of an object as defined in claim 3 wherein the interleaving process is based on a Fourier model of zero interleaving of signals.

5. A method for enhancing resolution of a magnetic resonance image of an object as defined in claim 3 comprising splitting an analog Fourier domain signal into the first and the second analog Fourier domain signal.

6. A method for enhancing resolution of a magnetic resonance image of an object as defined in claim 3 comprising determining the aperture function in dependence upon magnitude and phase differences between the first and second analog Fourier domain signal.

7. A method for enhancing resolution of a magnetic resonance image of an object as defined in claim 6 comprising determining a total phase difference between the first and second analog Fourier domain signal in the Fourier domain.

8. A method for enhancing resolution of a magnetic resonance image of an object as defined in claim 6 wherein the aperture function is set to unity in a region corresponding to an extended spectral range created by interleaving.

9. A method for enhancing resolution of a magnetic resonance image of an object as defined in claim 8 comprising smoothing transition of the aperture function into the unity region.

10. A method for enhancing resolution of a magnetic resonance image of an object as defined in claim 8 comprising adding a positive non-zero constant to the aperture function.

11. A method for enhancing resolution of a magnetic resonance image of an object as defined in claim 10 wherein the constant is determined such that a signal-to-noise ratio of the merged digital Fourier domain signal is substantially maximized.

12. A method for enhancing resolution of a magnetic resonance image of an object as defined in claim 11 wherein the constant is determined through an optimization procedure initialized using predetermined values for the constant.

13. A method for enhancing resolution of a magnetic resonance image of an object as defined in claim 8 comprising adding a positive non-zero varying parameter to the aperture function.

14. A method for enhancing resolution of a magnetic resonance image of an object as defined in claim 6 comprising estimating high frequency content of the aperture function based on high frequency data collected during a pre-scan.

15. A method for enhancing resolution of a magnetic resonance image of an object as defined in claim 6 wherein the deconvolution is performed based on Fourier division.

16. A method for enhancing resolution of a magnetic resonance image of an object comprising:
    receiving N analog Fourier domain signals indicative of N magnetic resonance images of an area of the object;
    superposing a phase ramp on each of the first to N−1$^{th}$ analog Fourier domain signals in frequency encode direction, the phase ramp corresponding to a different shift of a field of view of each of the first to N−1$^{th}$ images with respect to the field of view of the N$^{th}$ image of less than a pixel width;

discretizing the N analog Fourier domain signals producing N digital Fourier domain signals; merging in the Fourier domain the N digital Fourier domain signals producing a merged digital Fourier domain signal;

deconvoluting the merged digital Fourier domain signal using an aperture function; and, determining image data indicative of a synthesized magnetic resonance image of the area of the object by inverse Fourier transforming the merged digital Fourier domain signal, the synthesized magnetic resonance image having substantially higher resolution than the N magnetic resonance images.

17. A method for enhancing resolution of a magnetic resonance image of an object as defined in claim 16 comprising anti aliasing filtering the N analog Fourier domain signals.

18. A method for enhancing resolution of a magnetic resonance image of an object as defined in claim 17 comprising estimating high frequency content of the aperture function based on high frequency data collected during a pre-scan.

19. A method for enhancing resolution of a magnetic resonance image of an object as defined in claim 18 comprising adding a positive non-zero constant to the aperture function.

20. A method for enhancing resolution of a magnetic resonance image of an object as defined in claim 19 wherein the constant is determined such that a signal-to-noise ratio of the merged digital Fourier domain signal is substantially maximized.

21. A method for enhancing resolution of a magnetic resonance image of an object as defined in claim 17 comprising;

repeating the steps for a second set of N analog Fourier domain signals, the second set of N analog Fourier domain signals acquired along different axes of the frequency domain with respect to the object providing second image data indicative of at least another portion of a synthesized magnetic resonance image of the area of the object; and, combining the image data and the second image data producing combined image data.

22. A method for enhancing resolution of a magnetic resonance image of an object as defined in claim 20 wherein N is equal to 2.

23. A system for enhancing resolution of a magnetic resonance image of an object comprising:

a ramp circuitry for superposing a phase ramp on a first analog Fourier domain signal in frequency encode direction, the first analog Fourier domain signal being indicative of a first magnetic resonance image of an area of the object, the phase ramp corresponding to a shift of a field of view of the first magnetic resonance image with respect to the field of view of a second magnetic resonance image of less than a pixel width;

an A/D converter in communication with the ramp circuitry for discretizing the first analog Fourier domain signal and a second analog Fourier domain signal indicative of the second magnetic resonance image of the area of the object producing a first and a second digital Fourier domain signal; and, a processor in communication with the A/D converter, the processor for:

merging in the Fourier domain the first and the second digital Fourier domain signal producing a merged digital Fourier domain signal;

deconvoluting the merged digital Fourier domain signal using an aperture function; and, determining image data indicative of a synthesized magnetic resonance image of the area of the object by inverse Fourier transforming the merged digital Fourier domain signal, the synthesized magnetic resonance image having substantially higher resolution than the first and the second magnetic resonance image.

24. A system for enhancing resolution of a magnetic resonance image of an object as defined in claim 23 comprising an anti aliasing filter in communication with the ramp circuitry and the A/D converter for anti aliasing filtering the first and the second analog Fourier domain signal.

25. A system for enhancing resolution of a magnetic resonance image of an object as defined in claim 24 comprising a controller in communication with the ramp circuitry and the processor for controlling provision of the phase ramp in dependence upon a control signal received from the processor.

26. A system for enhancing resolution of a magnetic resonance image of an object as defined in claim 25 comprising an analog splitter in communication with the ramp circuitry for splitting an analog Fourier domain signal into the first and the second analog Fourier domain signal.

27. A storage medium having executable commands for execution on at least a processor stored therein, the at least a processor when executing the commands performing:

receiving a first digital Fourier domain signal indicative of a first magnetic resonance image of an area of an object;

receiving a second digital Fourier domain signal indicative of a second magnetic resonance image of the area of the object, the second digital Fourier domain signal having superposed a phase ramp corresponding to a shift of a field of view of the second magnetic resonance image with respect to the field of view of the first magnetic resonance image of less than a pixel width;

merging in the Fourier domain the first and the second digital Fourier domain signal producing a merged digital Fourier domain signal;

deconvoluting the merged digital Fourier domain signal using an aperture function; and, determining image data indicative of a synthesized magnetic resonance image of the area of the object by inverse Fourier transforming the merged digital Fourier domain signal, the synthesized magnetic resonance image having substantially higher resolution than the first and the second magnetic resonance image.

* * * * *